US010642747B1

(12) United States Patent
Jagtap et al.

(10) Patent No.: US 10,642,747 B1
(45) Date of Patent: May 5, 2020

(54) VIRTUAL FLASH SYSTEM

(71) Applicant: Seagate Technology LLC, Cupertino, CA (US)

(72) Inventors: Sachin Sudhir Jagtap, Pune (IN); Deepak Govind Choudhary, Pune (IN)

(73) Assignee: Seagate Technology LLC, Cupertino, CA (US)

( * ) Notice: Subject to any disclaimer, the term of this patent is extended or adjusted under 35 U.S.C. 154(b) by 176 days.

(21) Appl. No.: 15/976,044

(22) Filed: May 10, 2018

(51) Int. Cl.
*G06F 12/10* (2016.01)
*G11C 16/34* (2006.01)

(52) U.S. Cl.
CPC ...... *G06F 12/10* (2013.01); *G06F 2212/1044* (2013.01); *G06F 2212/7201* (2013.01); *G11C 16/34* (2013.01)

(58) Field of Classification Search
None
See application file for complete search history.

(56) References Cited

U.S. PATENT DOCUMENTS

| 6,026,230 | A | 2/2000 | Lin et al. | |
|---|---|---|---|---|
| 7,607,005 | B1 | 10/2009 | Lewis | |
| 2008/0046638 | A1* | 2/2008 | Maheshwari | G06F 12/0638 711/103 |
| 2008/0086588 | A1* | 4/2008 | Danilak | G06F 13/385 711/103 |
| 2009/0049274 | A1* | 2/2009 | Norman | G06F 12/06 711/219 |
| 2019/0130990 | A1* | 5/2019 | Liu | G06F 12/0246 |

OTHER PUBLICATIONS

Cai et al., "Read Disturb Errors in MLC NAND Flash Memory: Characterization, Mitigation, and Recovery", Article from Carnegie Mellon and Seagate, 2015, 12 pages. https://users.ece.cmu.edu/~omutlu/pub/flash-read-disturb-errors_dsn15.pdf.
Guo et al., "DPA: A data pattern aware error prevention technique for NAND flash lifetime extension", Presentation, Department of Electrical & Computer Engineering,University of Pittsburgh, Pittsburgh, Apr. 11, 2014, 23 pages. http://www.aspdac.com/aspdac2014/technical_program/pdf/7A-2.pdf.
Kim et al., "Flipping Bits in Memory Without Accessing Them: An Experimental Study of DRAM Disturbance Errors", Intel Labs, Carnegie Mellon University, 2014, 12 pages. https://users.ece.cmu.edu/~yoonguk/papers/kim-isca14.pdf.
Yamaga et al., "Real Usage-based Precise Reliability Test by Extracting Read/Write/Retention-Mixed Real-life Access of NAND Flash Memory from System-level SSD Emulator", Department of Electrical, Electronic, and Communication Engineering, Chuo University, Tokyo, Japan , 2017, 5 pages.

* cited by examiner

*Primary Examiner* — Denise Tran
(74) *Attorney, Agent, or Firm* — Setter Roche LLP; Kirk A Cesari

(57) ABSTRACT

An apparatus may include a virtual flash device configured to emulate a flash memory device. The virtual flash device may include a flash interface configured to communicate with a flash controller, an address translation module configured to translate memory addresses from a flash based memory space to another memory space of another memory, a threshold voltage shift module configured to modify data on a data path between the flash controller and the other memory to simulate data corruption caused by threshold voltage shifts in cells of the emulated flash memory device, and a non-flash memory controller configured to communicate with the other memory.

20 Claims, 11 Drawing Sheets

VIRTUAL FLASH SYSTEM

SUMMARY

In some embodiments, an apparatus may include a virtual flash device configured to emulate a flash memory device. The virtual flash device may include a flash interface configured to communicate with a flash controller, an address translation module configured to translate memory addresses from a flash based memory space to another memory space of another memory, a threshold voltage shift module configured to modify data on a data path between the flash controller and the other memory to simulate data corruption caused by threshold voltage shifts in cells of the emulated flash memory device, and a non-flash memory controller configured to communicate with the other memory.

In some embodiments, a device may include a virtual flash device configured to emulate a flash memory device, the virtual flash device including a field-programmable gate array (FPGA). The virtual flash device may include a flash interface configured to communicate with a flash controller, an address translation module configured to translate memory addresses from a flash based memory space to a memory space of a DDR SDRAM memory device, a threshold voltage shift module configured to modify data on a data path between the flash controller and the DDR SDRAM memory device to simulate data corruption caused by threshold voltage shifts in cells of the emulated flash memory device, a meta data and control module configured to manage meta data from the emulation of the flash memory device, the meta data including threshold voltage shifts of cells of the emulated flash memory device and a DDR SDRAM controller configured to communicate with the DDR SDRAM memory device.

In some embodiments, a method may include configuring a virtual flash device to emulate a flash memory device, the virtual flash device including a FPGA and the virtual flash device including a flash interface configured to communicate with a flash controller and a DDR SDRAM controller configured to communicate with the DDR SDRAM memory device. The virtual flash device may then receive a read command from the flash controller, translating a memory address from a flash based memory space included in the read command to a memory space of a DDR SDRAM memory device, retrieving data from the DDR SDRAM memory device using the translated memory address, modifying the retrieved data to simulate data corruption caused by threshold voltage shifts in cells of the emulated flash memory device, and outputting the modified data to the flash controller as a response to the read command.

DETAILED DESCRIPTION

Figure 1:
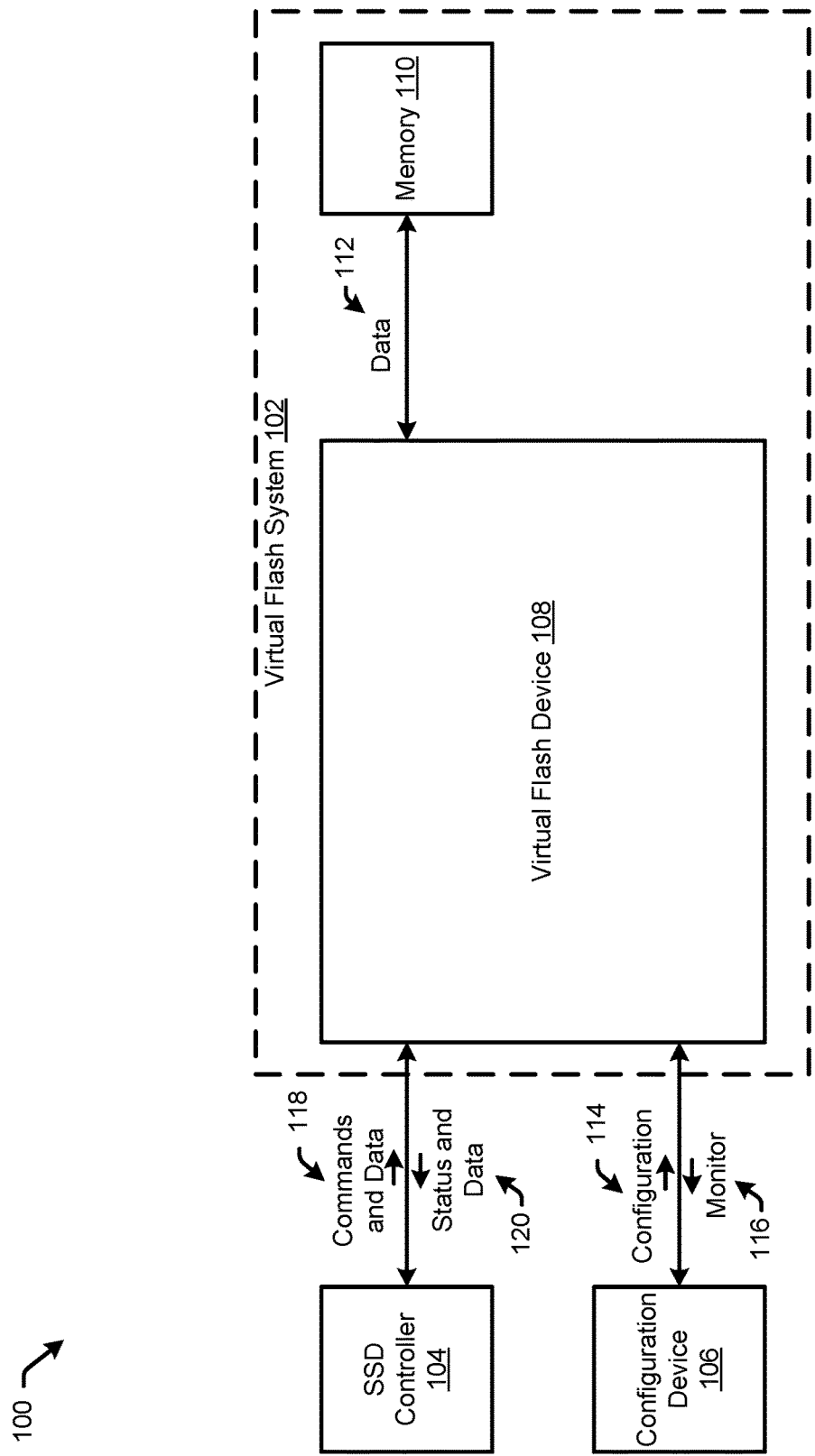
FIG. 1 is a block diagram of a system that includes a virtual flash system that may emulate a flash storage device to a flash storage controller, in accordance with certain embodiments of the present disclosure.

In the following detailed description of the embodiments, reference is made to the accompanying drawings which form a part hereof, and in which are shown by way of illustrations. The features of the various embodiments and examples described herein may be combined, exchanged, removed, other embodiments utilized, and structural changes made without departing from the scope of the present disclosure.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

In accordance with various embodiments, dedicated hardware implementations including, but not limited to, application specific integrated circuits, programmable logic arrays, and other hardware devices can be constructed to implement the methods and functions described herein. Further, the methods and functions described herein may be implemented as a device, such as a memory device, including instructions that when executed cause a processor to perform the methods.

The present disclosure generally relates to devices and systems for testing controllers, and in some embodiments, the present disclosure relates to devices and systems that may emulate a flash storage device to a flash storage controller to allow for testing of the operation of the flash storage controller.

Testing flash controllers using flash storage may require long test cycles as flash storage devices may take thousands of program and erase (PE) cycles or read (RD) operations before it wears out or experiences corruptions due to threshold voltage shift (e.g. read disturb), respectively. Regarding another flash behavior, retention, a flash storage device or portion thereof (e.g. a block) may need years of non-use before corruption due to retention loss which may cause threshold voltages shift. Further issues may arise due to logistics involved in procuring suitably worn or conditioned flash storage and attempting to track flash storage wear or condition.

Some implementations of the technology described herein include a virtual flash system that may emulate a flash storage device including a variety of flash behavior. Some examples may include a programmable circuit which is connectable between a flash storage controller (e.g. an SSD controller) and a memory device (e.g. a DDR SDRAM memory). Some implementations may also avoid the above noted problems and other problems associated with the non-repeatable nature of flash due to its wear, use or non-use characteristics and other real world variations.

For example, some implementations may simulate flash behaviors or conditions in a controllable manner, such that different behaviors or scenarios can be emulated. In some examples, flash behaviors (e.g. data corruption) resulting from wear (e.g. due to program/erase cycles) may be simulated. In many flash storage devices, each time when a program or erase operation is performed on a flash storage cell (e.g. usually as a group such as a page or block), some permanent damage may be introduced into the cell. The number of the cycles a memory may perform before failure may be on the order of $10^6$ cycles or higher. However, cells may degrade or weaken much earlier and the controller may be tested for its ability to handle the degraded storage device. Alternatively or additionally, implementations may simulate flash behavior that may change the contents of the flash storage due to shifts in threshold voltages (e.g. read disturbances and retention loss). More particularly, flash storage cells may lose charge over time which may lower (e.g. shift) the threshold voltage of the stored contents. If the threshold lowers enough, the data may change and become corrupt. Further, each read of a flash storage cell may increase the charge in the cell by a small amount (e.g. shifting the threshold voltage up). After repeated reads, the threshold voltage may be increased sufficiently to cause the data stored in the cell to change. Similar voltage increases may be introduced by writes and reads to nearby pages. As with wear, flash controllers may be tested for their ability to overcome data corruption due to threshold voltage shifts (e.g. retention loss and read disturbances). By emulating a flash storage device including such simulated flash behavior, implementations may allow for the operation of flash controllers encountering such flash behaviors to be tested.

Such behaviors and scenarios may be provided in a predefined library of flash behavior and past scenarios that may be loaded into the virtual flash system to cause the virtual flash system to behave like a desired type of flash with specific behaviors. Such a library may allow testing of the flash controller for a wide variety of complex flash failures or a much wider range of flash behavior without dependency on a supply chain providing flash storage devices having the desired failures, wear or other conditions. Further, some implementations may also allow for a processor (e.g. a portion of the virtual flash system or external thereto) to check the correctness of program/erase (PE) or read (RD) counts, the correctness of the bad block map after a test, etc. Such implementations may greatly reduce the testing cycle (e.g. by an order of magnitude) while providing test results for a very broad and deep swathe of flash behavior which may enable early bug discovery and minimize or eliminate late breaking bad news.

Although the examples herein may be illustrated and described in the context of SSD controllers, this is merely for ease of discussion. Further, embodiments of the disclosed subject matter are not limited to this context. For example, the techniques and systems disclosed may be used with any flash storage controller similar to or which provide similar functionality to those of SSD controllers.

Referring to FIG. 1, a block diagram is shown of a system that includes a virtual flash system 102 that may emulate a flash storage device to a flash storage controller and which is generally designated 100. The components of system 100 may include a virtual flash system 102 coupled to a SSD controller 104 and a configuration device 106. Further, the virtual flash system 102 may include a virtual flash device 108 coupled to a memory 110. The virtual flash device 108 may connect to and emulate a flash storage device to the SSD controller 104 using the memory 110 as storage for data 112 that would otherwise be stored to the emulated flash storage device. The configuration device 106 may be coupled to the virtual flash system 102 and may be operable to program or configure the virtual flash system 102. In some implementations, the form factor of the virtual flash system 102 may be configured to match the form factor of the flash storage device being emulated or a standard form factor for flash storage devices.

In operation, the configuration device 106 may send configuration information 114 to the virtual flash device 108 and receive monitor information 116 from the virtual flash device 108. For example, the configuration information 114 may include the type of flash storage device to be emulated, the condition of the flash storage device to be emulated, and what monitoring should be done, and so on.

The virtual flash device 108 may be capable of supporting many or all flash protocols and speed variants. For example, the virtual flash device 108 may to support some or all of the following flash protocols:
  1. Asynchronous
  2. ONFI2-Source Synchronous
  3. ONFI3-NV DDR
  4. ONFI3-NV DDR2
  5. ONFI4-NV DDR
  6. ONFI4-NV DDR2
  7. Toggle2
  8. Toggle3

The conditions to be emulated may include a variety of a flash behaviors including wear, threshold voltage shift (e.g. read disturbance, retention, etc.) and other types of flash behavior such as inter-cell interference. Using the flash behavior model, the virtual flash device may mimic flash wear behavior sufficiently to emulate different levels of wear from a brand-new flash storage device and a totally worn out dead flash. The flash behavior model may also cause the virtual flash device to mimic flash behavior sufficiently to emulate a spectrum of data corruption in stored data caused by degrees of retention loss or read disturbance. In some examples, the flash behavior model may be expressed as a formulaic transformation of data that may be implemented as the data 112 is written to or read from the memory 110. While some implementations may include functionality for emulating wear, threshold voltage shifts, or failure conditions, other implementations may emulate the behavior of a flash storage device in good condition to allow for testing of flash storage controllers for normal operation. Such an example is shown and discussed with regard to FIG. 2 while an example implementation including functionality for emulating wear, threshold voltage shift, or failure conditions is shown and discussed with regard to FIG. 3.

The virtual flash device 108 may receive the configuration information 114 from the configuration device 106, configure the virtual flash system 102 for operation and then connect to and emulate a flash storage device to the SSD controller 104 using the memory 110 as storage for data 112 that would otherwise be stored to the emulated flash storage device. The virtual flash device 108 may also provide monitor information 116 to the configuration device 106.

As mentioned above, the virtual flash device 108 may return monitor information 116 to the configuration device 106. The specific information returned as monitor information may vary from implementation to implementation. For example, the monitor information may range from detailed metadata and complete system state dumps to very high level performance reports. In some examples, the monitor information may include PE or RD counts, a bad block map, and so on. Though not shown, additional monitor information may be received from the SSD controller.

Once the virtual flash device 108 has configured the system for operation, the SSD controller 104 may begin issuing commands (e.g. read, write, erase, etc.) and write data 118 to the virtual flash device 108 while receiving status information and read data 120. As the interface between the SSD controller 104 and virtual flash device 108 is intended to emulate the communications between the SSD controller and the emulated flash storage device, one of ordinary skill in the art would understand the particulars of the communication in view of this disclosure.

In some implementations, the virtual flash device 108 may operate such that all the processing for the write path and read path, along with the behavior modeling and bookkeeping of meta-data is contained within the virtual flash device 108. In addition, the virtual flash device 108 may perform address translation between an emulated address space of the emulated flash storage device and an address space of the memory 110. In other words, such implementations may include a virtual flash device 108 which operates such that the SSD controller 104 operates as if connected to a normal flash storage device, the memory 110 has no specialized functionality, and the configuration device 106 may not need to be involved after providing configuration information (e.g. other than receiving any desired real time monitor information). However, configuration device 106 may input changes to the virtual flash device on the fly (e.g. instructing the virtual flash device 108 to introduce a new emulated failure on the fly, requesting the virtual flash device 108 dump the entire state of the virtual flash system 102, requesting the virtual flash device 108 provide different or additional monitor information, etc.).

In some implementations, the virtual flash device 108 may be a field-programmable gate array (FPGA). An FPGA may be an integrated circuit designed to be configured by a customer or a designer after manufacturing (e.g. "field-programmable"). FPGAs may contain an array of programmable logic blocks and a hierarchy of reconfigurable interconnects that may allow the blocks to be "wired together", like many logic gates that can be inter-wired in different configurations. Logic blocks may be configured to perform complex combinational functions, or simple logic gates like AND and XOR. In some FPGAs, logic blocks may also include memory elements, which may be simple flip-flops or more complete blocks of memory.

The memory 110 is not limited to a specific type of memory and may be any sufficiently fast digital storage. Some implementations may use a memory that does not exhibit wear (e.g. DDR SDRAM memory). In the case of using a DDR memory, multilevel cell flash and triple level cell flash can be emulated using two or three DDR SDRAM memory bits per flash cell, respectively.

Figure 2:
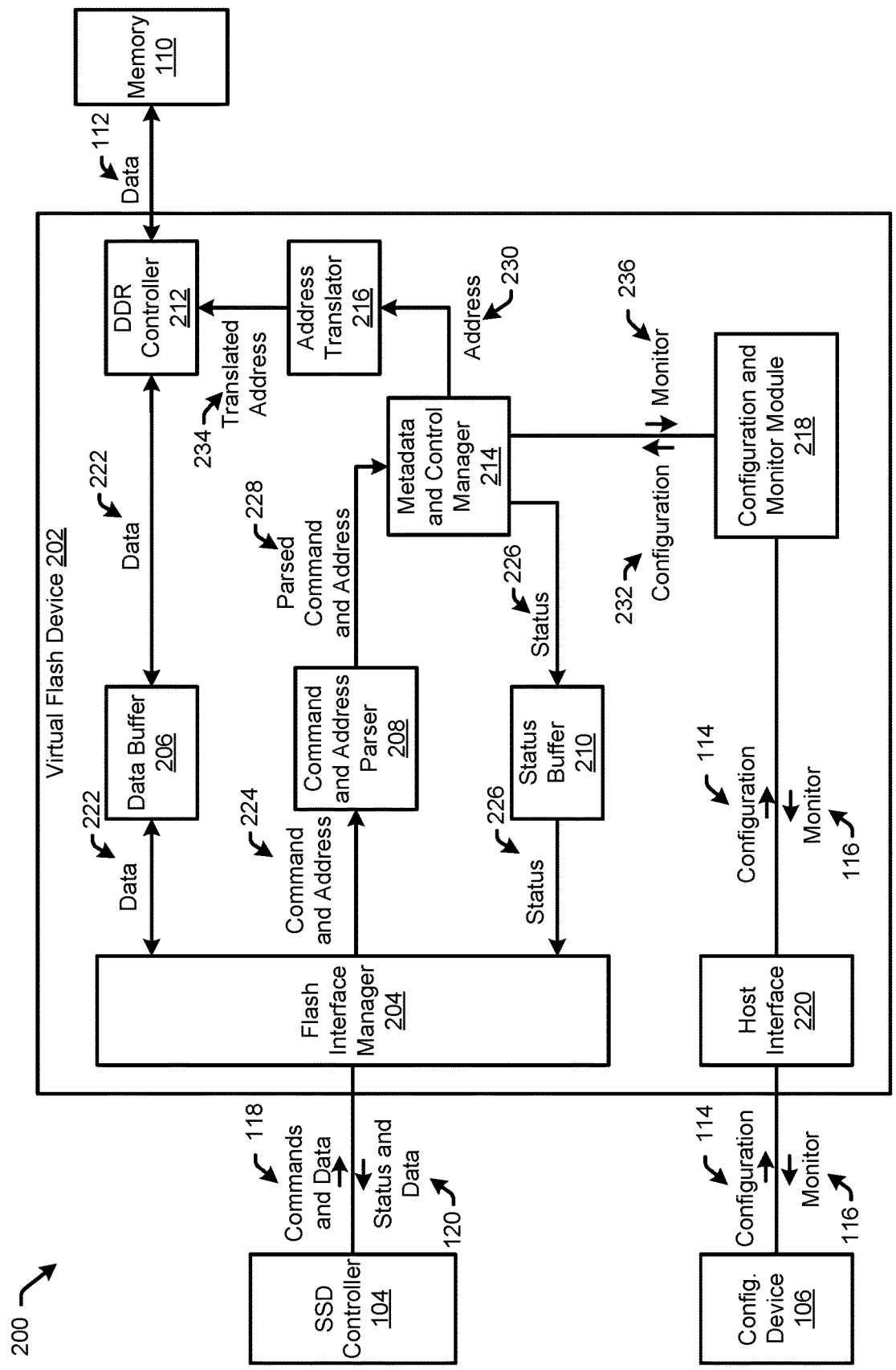
FIG. 2 is a block diagram of a system that includes a virtual flash device that may emulate a flash storage device to the flash storage controller, in accordance with certain embodiments of the present disclosure.

Referring to FIG. 2, a block diagram is shown of a system that includes a virtual flash device 202 that may emulate a flash storage device to a flash storage controller and which is generally designated 200. More particularly, in the example system 200 illustrated in FIG. 2, the virtual flash device 202 may be an example of a type of virtual flash device that emulates the behavior of a flash storage device in good condition. Such implementations may be used for testing flash storage controllers for normal operation. Such testing using actual flash storage devices may suffer due to lack of knowledge of whether a failure was caused by bugs in the flash controller or the flash controller firmware or unknown wear or failure in the flash storage device. The components of the virtual flash device 202 may operate in a similar manner to the virtual flash device 108 discussed above with regard to FIG. 1. As such, discussion of the general functions of the virtual flash device 202 and a description of similar operations will not be repeated for sake of brevity.

The virtual flash device 202 may include a flash interface manager 204 that may interface with the SSD controller 104 and that may be coupled to a data buffer 206, a command and address parser 208, and a status buffer 210. The data buffer 206 may be coupled to a DDR controller 212 that may interface with the memory 110. The command and address parser 208 may be coupled to a metadata and control manager 214 which is in turn coupled to the status buffer 210, an address translator 216 and a configuration and monitor module 218. The address translator 216 may be coupled to the DDR controller 212. Finally, the configuration and monitor module 218 may be coupled to a host interface 220 that may interface with the configuration device 106.

In operation, the flash interface manager 204 may receive the commands and data 118 from the SSD controller 104. The flash interface manager 204 may provide the data portion of 118 to the data buffer 206 as data 222 and provide the command portion of 118 to the command and address parser 208 as command and address 224. Further, the flash interface manager 204 may receive read data 222 from the data buffer 206 and status information 226 from the status buffer 210. The flash interface manager 204 may then output the received status and read data as status and data 120.

The data buffer 206 may operate as a buffer for the flash interface manager 204 and DDR controller 212. More particularly, the data buffer 206 may buffer write data from the SSD controller 104 until the associated command is processed and the DDR controller 212 is ready to output the write data to the memory 110. Similarly, the data buffer 206 may buffer read data from the memory 110 until the associated command is processed, associated status information 226 is prepared and the flash interface manager 204 is ready to output the status information and read data to the SSD controller 104. The status buffer 210 may operate in a similar manner as a buffer for the flash interface manager 204. For example, the status buffer 210 may buffer status information 226 until an associated read command is processed and the flash interface manager 204 is ready to output the status information 226 and associated read data to the SSD controller 104.

The command and address parser 208 may operate to receive the command and address 224 from the flash interface manager 204. The command and address parser 208 may then parse the command and address 224 from the format used by the SSD controller 104 into a parsed command and address 228 in a format usable by the metadata and control manager 214.

The host interface 220 may interface with the configuration device 106 and the configuration and monitor module 218. As such, the host interface may receive the configuration information 114 from the configuration device 106 and send the configuration information 114 to the configuration and monitor module 218. Further, the host interface 220 may receive monitor information 116 from the configuration and monitor module 218 and send the monitor information 116 data to the configuration device 106. The particular protocol used by the host interface when communicating with the configuration device 106 may vary. In some implementations, the host interface 220 may communicate with the configuration device 106 using an Ethernet interface.

The configuration and monitor module 218 may receive configuration information 114 from the host interface 220 and return monitor information 116 to the host interface 220. The configuration and monitor module 218 may utilize the configuration information 114 and generate an initial configuration for the virtual flash device 202. The initial configuration may be provided to the metadata and control manager 214 as configuration information 232. The configuration and monitor module 218 may receive monitor information 236 from the metadata and control manager 214. The monitor information 236 may be the same as monitor information 116 or may differ. Examples of monitor information 236 which differ from monitor information 116 may include raw monitor information, monitor information including additional internal information, monitor information in an alternative format, etc. In some implementations, the configuration and monitor module 218 may update the configuration information 232 during operation, for example, based on changes in the configuration information 114 during operation, based on the monitor information 236 and so on (e.g. instructing the virtual flash device 108 to introduce a new emulated failure on the fly, requesting the virtual flash device 108 dump the entire state of the virtual flash system 102, requesting the virtual flash device 108 provide different or additional monitor information, a determination that the metadata indicates a threshold has been reached, etc.). Additional discussion of a configuration and monitor module 218 updating the configuration information 232 based on monitor information 236 is provided below with regard FIG. 3.

The metadata and control manager 214 may receive the configuration information 232 from the configuration and monitor module 218. Based on the received configuration information 232, the metadata and control manager 214 may configure or program various components of the virtual flash device 202 to emulate the indicated flash storage device, to emulate any indicated flash behavior (e.g. wear, threshold voltage shift, failures, etc.), to perform the internal operations to perform the emulation, and to perform the indicated monitoring. For example, the metadata and control manager 214 may configure the parsing operation of the command and address parser 208 as well as the address translation operation of the address translator 216. In another example, the metadata and control manager 214 may configure the interface provided to the SSD controller 104 by the flash interface manager 204. More particularly, the flash interface manager 204 may implement a parametric ONFI2/3/4 or Toggle2/3 or Async device interface. The interface may be "parametric" in the sense that its behavior in terms of signal timing may be controllable via parameters. The metadata and control manager 214 may further configure the status information provided to the SSD controller 104 by the flash interface manager 204. Example status information that may be maintained by the flash interface manager 204 as part of the parametric interface may include an ONFIx/ToggleX status register, a read latency parameter, a device ready parameter, a device fail parameter, and a detection threshold. Of course, these examples are not limiting and the status information provided may vary based on the type of flash storage device being emulated (e.g. based on the standard or specifications of the emulated flash storage device).

During emulation, the metadata and control manager 214 may receive the parsed command and address 228 from the command and address parser 208. Based on the parsed command and address 228, the metadata and control manager 214 may operate to perform book-keeping of metadata for the virtual flash device 108. The metadata being stored may vary from implementation to implementation depending on the desired emulation scenario. For example, some implementations may include metadata such as one or more of a list of all commands and respective addresses received by the virtual flash system with time stamps, what statuses were returned for those commands, and various counters (e.g. read cycle counters, program/erase cycle counters, etc.), and so on. Some example implementations may utilize such metadata for debugging SSD controller failures or to improve performance of the SSD controller. In some examples, the counters may be used cross check if firmware counters are working properly. The counters may also be used to check if all SSD algorithms like wear leveling are working as expected. Examples of the metadata are discussed with regard to FIGS. 3-11. In addition, the metadata and control manager 214 may provide the address to the address translator 216.

The address translator 216 may operate to translate addresses between the addressing scheme of the indicated flash storage device to be emulated and the DDR memory addressing scheme.

The DDR controller 212 may operate to store data to and retrieve data from the memory 110. The memory address of the memory 110 that the DDR controller stores data to or retrieves data from may be a translated address 234 from the address translator 216.

The virtual flash device 202 may include functionality to save and restore the current state of the virtual flash device 202 and memory 110 to the configuration device 106. For example, the configuration device 106 may initiate the save process as part of the configuration information sent to the virtual flash device 202 during an emulation operation. The configuration and monitor module 218 may receive the save request and issue instructions to various components of the virtual flash device 202 and the memory 110 to suspend operation and provide a copy of the current state of the components to the configuration and monitor module 218. Upon receiving the current state data, the configuration and monitor module 218 may return the current state data to the configuration device as monitor information 116. The operations of the virtual flash device 202 may then resume or remain suspended. Subsequently, a similar process may be utilized to restore the virtual flash device to the saved state.

Figure 3:
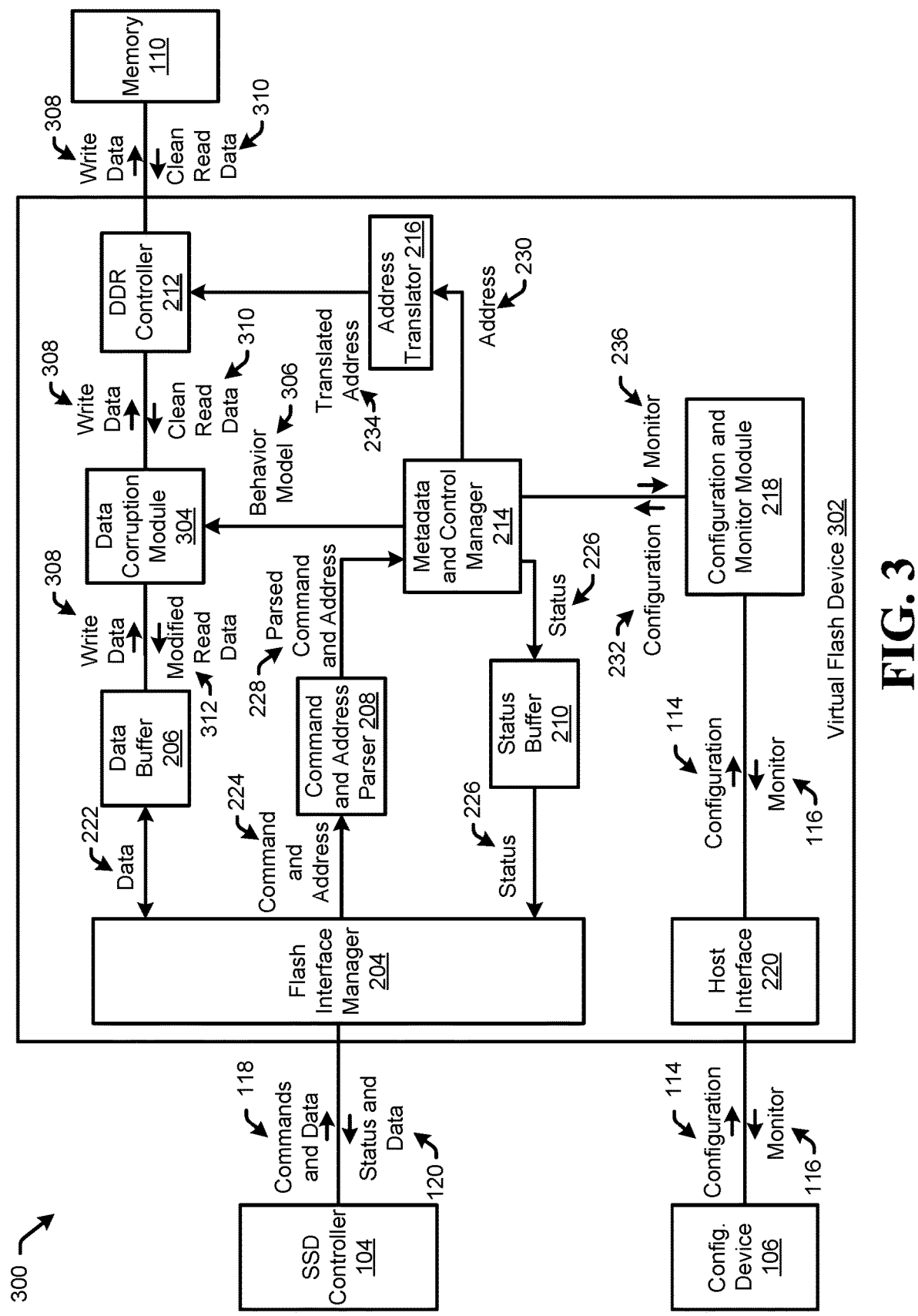
FIG. 3 is a block diagram of a system that includes a virtual flash device that may emulate a flash storage device to a flash storage controller, in accordance with certain embodiments of the present disclosure.

Referring to FIG. 3, a block diagram is shown of a system that includes a virtual flash device 302 that may emulate a flash storage device to the flash storage controller and which is generally designated 300. More particularly, in the example system 300 illustrated in FIG. 3, the virtual flash device 302 may be an example of a type of virtual flash device that emulates the behavior of a flash storage device with wear, threshold voltage shifts (e.g. retention loss, read disturbances) or other less than ideal conditions (e.g. inter-cell interference, etc.). Such implementations may be used for testing the ability of flash storage controllers to handle worn or partially failing flash storage devices and flash devices whose stored contents may have changed since written (e.g. due to threshold voltage shift). As discussed above, such testing using actual flash storage devices may suffer due to lack of repeatability and difficulty in obtaining suitable test flash storage devices. The components of the virtual flash device 302 may operate in a similar manner to the virtual flash devices 108 and 202 discussed above with regard to FIGS. 1 and 2. As such, discussion of the general functions of the virtual flash device 302 and a description of similar operations will not be repeated for sake of brevity.

In addition to the components of the virtual flash device 202, the virtual flash device 302 may include a data corruption module 304. In the example illustrated in FIG. 3, the data corruption module 304 is positioned on the data path between the data buffer 206 and the DDR controller 212. The data corruption module 304 is also coupled to the metadata and control manager 214.

In operation, the metadata and control manager 214 may determine a behavior model 306 based on the configuration information 232 and provide the behavior model 306 to the data corruption module 304.

As discussed above, storing to or accessing the same location in a flash storage device repeatedly may result in wear. By tailoring the behavior model 306, the virtual flash device 302 may emulate flash storage devices with different levels of wear that may range from a brand-new flash storage device to a totally worn out dead flash storage device.

In some implementations, the behavior model 306 may define wear, threshold voltage shift or similar issues on a per page basis. For example, in some flash storage devices, wear may result from program and erase cycles, read disturbance may result from read operations (e.g. on surrounding pages within a block) and retention loss may result from a lack of read or write operations over time. Because erase operations may be on a per block or page level and because overwriting any portion of a block may require the block be erased first, tracking the number of erases that have been performed on the block may provide a general estimate of the amount of wear that can be expected for that block and the pages within that block. Similarly, tracking the number of reads and the time since the last read operation for each page may provide for a general estimate of both read disturbance and retention loss.

There are multiple ways of achieving the flash behavior model 306. For example, a simple behavior model 306 may define a bit mask for bits of each flash page. In such an example, the set bits (e.g. bits set to true) in the bit-mask may indicate that the bit should be treated as corrupted. As such, using such a bit mask, the data corruption module 304 may flip the bits masked as corrupt during either writes or reads. In the example, shown in FIG. 3, write data may be stored in a clean form (e.g. the data corruption module 304 may pass write data 308 through to the DDR controller 212 and on to memory 110 for storage). During a read operation, the still clean data may be read from memory 110 as clean read data 310 by the DDR controller 212. The data corruption module 304 may receive the clean read data 310 and apply the behavior model 306 to generate modified read data 312 which simulates read data that may be returned from a flash storage device having corruption characteristics defined by the behavior model 306. However, implementations are not limited to storing clean data and applying the behavior model 306 on the read path. In other implementations, the behavior model may be applied to the write data such that modified write data is stored to the memory 110. In such implementations, the read path may pass the data read from the memory 110 through the data corruption module 304 without modification.

In an example that models wear, the configuration and monitor module 218 may include a number of predefined flash wear levels. As such, each wear level may indicate the number of bit corruptions in each of the flash memory pages having the respective wear level of the flash behavior model 306. In some implementations, the configuration and monitor module 218 may randomly select the indicated number of bit locations from among bit locations in the flash memory page to set as corrupt in the bit mask of the behavior model 306. In other implementations, the configuration and monitor module 218 may include one or more predefined bit masks for each wear level and may choose a predefined bit mask associated with the wear level to include in the behavior model based on the wear level determined for that page.

In other examples, the behavior model 306 may provide for simulating additional flash behavior. Such additional behaviors may be included in a static bit mask or may be simulated in some other manner depending on the particular behavior. For example, another type of flash storage behavior that may be simulated is inter-cell-interference. Inter-cell-interference is a phenomenon in which value of a bit may be affected by the values of surrounding bits. To simulate such a phenomenon, the data corruption module 304 may dynamically perform processing on the current bit value while considering the values of surrounding bits to determine whether to flip the current bit value. Additional information for processes and systems for performing modeling for threshold voltage shifts are provided below with regard to FIGS. 5-11.

In some implementations, the configuration and monitor module 218 may include a library of flash behavior and past scenarios that may be selected by the configuration device 106 to cause the virtual flash device 102 to behave like a desired type of flash with specific behaviors or wear level. Such a library may allow testing of the SSD controller 104 for a wide variety of complex flash failures or a much wider range of flash behavior without dependency on a supply chain providing flash storage devices having the desired failures, wear or other conditions. In other implementations, a library of flash behavior and past scenarios may be included on the configuration device 106 which may instead issue lower level configuration instructions to the configuration and monitor module 218 based on a user selection of from among the library at the configuration device 106.

Additionally, some implementations may utilize metadata being maintained by the book-keeping functionality of the metadata and control manager 214 to update the behavior model 306 during operation. In an example implementation, the meta-data that may to be stored per page may include a program/erase (PE) counter (16 bit), a read (RD) counter (16 bit), and a behavior model index number (8 bit) (e.g. an index value that points to a behavior model selected for the particular page). For a 16K page size, to emulate an 8 GB drive, there may be 514K entries in the meta-data table. As such, the footprint for maintaining this metadata may utilize three megabytes (3 MB) of storage in the virtual flash device or another storage location accessible to the virtual flash device.

Figure 4:
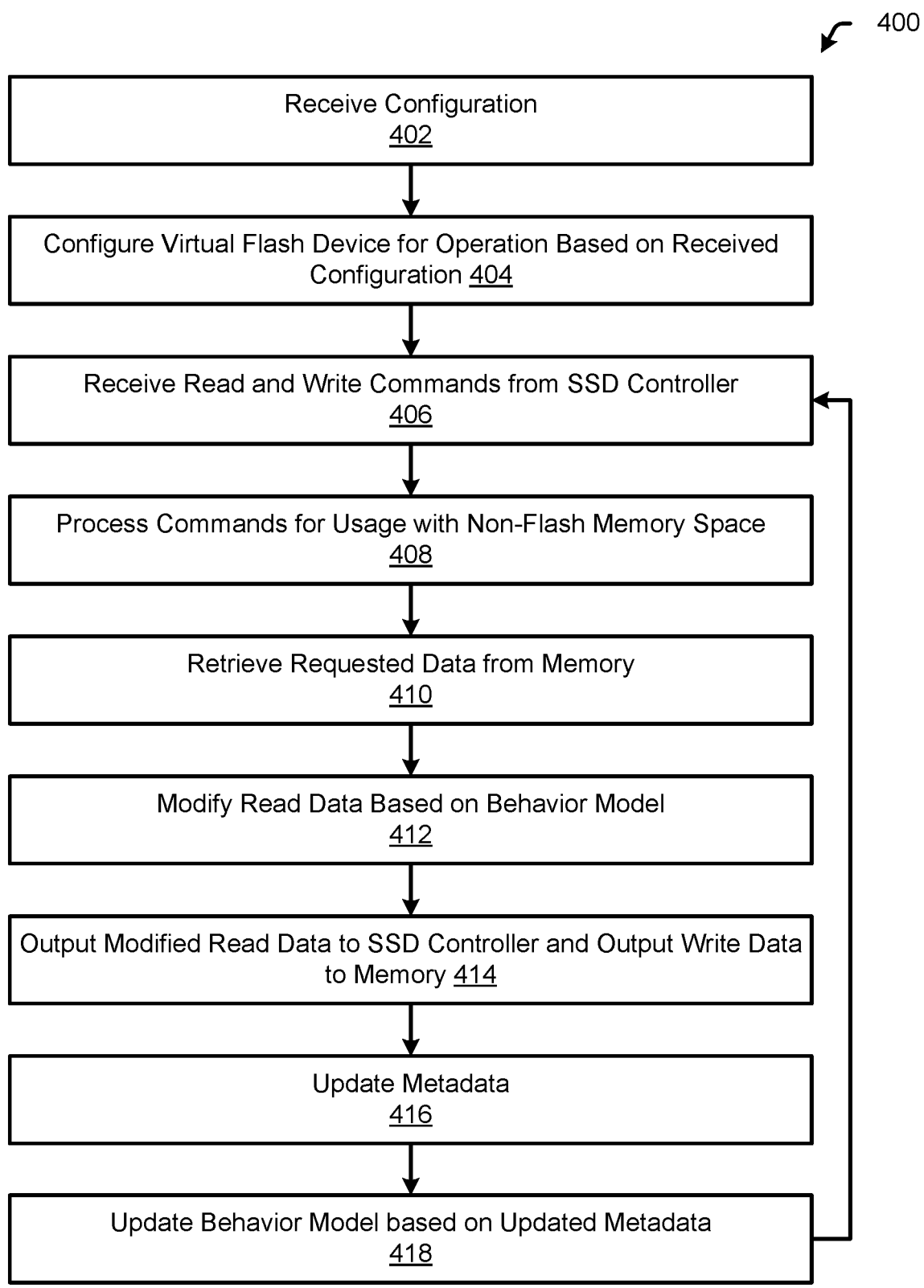
FIG. 4 is a flowchart of a method of emulating a flash storage device to a flash storage controller, in accordance with certain embodiments of the present disclosure.

Referring to FIG. 4, a flowchart of a method of emulating a flash storage device to a flash storage controller is shown and generally designated 400, in accordance with certain embodiments of the present disclosure. Specifically, FIG. 4 provides an example method of the operation of systems 100-300 to allow a virtual flash system to emulate a flash storage device to a flash storage controller, for example, for purposes of testing the behavior of the flash controller when operating with flash storage device.

At 402, the virtual flash device may receive configuration information (e.g. from a configuration device). At 404, the virtual flash device may configure itself for operation based on the received configuration. If indicated by the configuration information, this may include configuring a behavior model for the read or write path which may be a transformative operation simulating wear or other flash storage device behavior. In the example of FIG. 4, the transformative operation to simulate wear is performed on the read path.

At 406, the virtual flash device may receive read and write commands from an SSD controller. At 408, the virtual flash device may process the commands for usage with a non-flash memory space of a memory device being used as storage during the emulation. This may include an parsing the commands and an address translation operation to translate from the address space used by the SSD to issue commands to the address space used by the virtual flash device to store information to the non-flash memory.

At 410, the virtual flash device may retrieve the requested read data from the non-flash memory. At 412, the virtual flash device may modify the retrieved read data based on the configured behavior model or other transformative operation. At 414, the virtual flash device may output modified read data to the SSD controller and output write data to the memory.

At 416, the virtual flash device may update metadata regarding wear, threshold voltage shifts, usage or other flash storage behavior (e.g. PE cycle counts). Based on the updated meta data, the virtual flash device may update the behavior model (e.g. when metadata indicates a threshold or other condition has been reached). The process may then return to 406 and other commands may be processed.

Many variations would be apparent in view of this disclosure. Further, many of the features discussed herein may not be included in all implementations.

Figure 5:
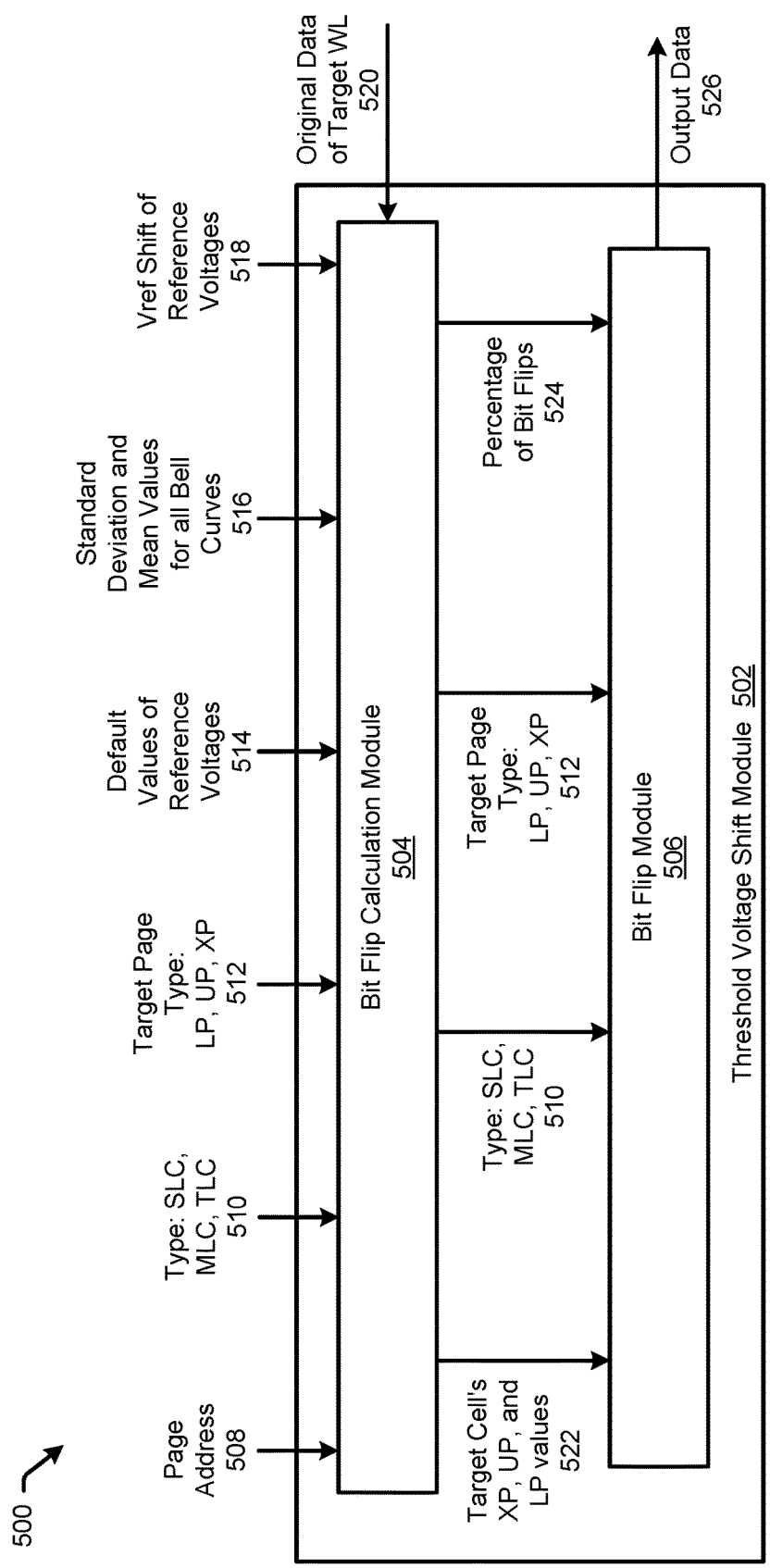
FIG. 5 is a block diagram of a system that includes a threshold voltage shift module of a virtual flash system that may emulate a flash storage device to the flash storage controller, in accordance with certain embodiments of the present disclosure.

Referring to FIG. 5, a block diagram is shown of a system that includes a threshold voltage shift module of a virtual flash system that may emulate a flash storage device to the flash storage controller and which is generally designated 500. More particularly, in the example system 500 illustrated in FIG. 5, a threshold voltage shift module 502 may be a part of a data corruption module of a virtual flash device that emulates the behavior of a flash storage device with wear, threshold voltage shift or other less than ideal conditions (e.g. retention loss, read disturbances, inter-cell interference, etc.). The illustrated modules of the system 500 may operate to simulate threshold voltage shifts due to retention loss, read disturbance and other flash behavior that includes a shift in the threshold voltage of flash cells. Some implementations may be used for testing flash storage controllers for its ability to handle flash devices whose stored contents (e.g. threshold voltages) may have changed since being written. As discussed above, such testing using actual flash storage devices may suffer due to lack of repeatability and difficulty in obtaining suitable test flash storage devices.

As illustrated, the threshold voltage shift module 502 may include a bit flip calculation module 504 and a bit flip module 506. Though the example discussed herein refers to these modules being included in a data corruption module 304, some or all of these modules or portions thereof may be included in a metadata and control manager 214 or some other portion of the virtual flash device 302.

In operation, the bit flip calculation module 504 and the bit flip module 506 may operate to simulate data corruption due to retention loss, read disturbances or other flash behavior that includes a shift in the threshold voltage of flash cells. For example, the bit flip calculation module 504 may determine a percentage of cells of a page whose bit should be flipped based on the simulated characteristics of the emulated flash storage device. Then, the bit flip module 506 may apply the determined bit flips (e.g. the determined data corruption) to, for example, read data. In the example illustrated in FIG. 5, the bit flip calculation module 504 and the bit flip module 506 may be included in a data corruption module (e.g. such as 304) that is positioned on the read data path between a data buffer and a DDR controller. The bit flip calculation module 504 and the bit flip module 506 of the data corruption module may also receive configuration data from a metadata and control manager (e.g. such as 214).

In some examples, a virtual flash device may apply a wear mask (used for introducing errors based on wear) to read data of a page and then determine other bits that may be flipped due to a shift in the threshold voltage of the flash cells. As such, when a read command is sent by SSD controller to virtual flash device, the DDR controller may retrieve the data (e.g. of a page) from the DDR SDRAM memory and process the retrieved data for both wear and threshold voltage shift, then return the modified read data to the SSD controller.

In operation, the bit flip calculation module 504 may receive information regarding a current page. The information regarding the current page may be based on configuration information from a configuration device. Further, the page information may be updated each time a read operation is performed for the current page (e.g. a threshold voltage shift may be increased by some amount to simulate read disturbance). Such page information may be maintained by a metadata and control manager (e.g. 214).

As shown, when emulating a threshold voltage shift behavior (e.g. read disturbance, retention, etc.), the bit flip calculation module 504 may receive:

a page address 508 which may include the die, plane, block and page number of the current page being processed;

a type of the emulated flash storage device 510 or, in devices which include multiple types of cells, the type of the word line (e.g. single level cell (SLC), multi level cell (MLC), triple level cell (TLC), etc.);

a target page type 512 (e.g. a lower page (LP), an upper page (UP), an extra page (XP), etc.);

default values for the reference voltages 514 associated with the current page (e.g. XP1 $V_{ref}$, XP2 $V_{ref}$, XP3 $V_{ref}$ and XP4 $V_{ref}$ for an extra page of TLC; UP1 $V_{ref}$ and UP2 $V_{ref}$ for an upper page of TLC or MLC; a LP $V_{ref}$ for TLC, MLC or SLC lower page; etc.);

a mean value ($\mu$) and a standard deviation ($\sigma$) 516 for the bell curve of threshold voltage values for each cell value that may be stored by the cells associated with the flash storage device type (SLC flash cells may have two bell curves representing 0 and 1, MLC flash cells may have four bell curves representing 11, 01, 10, 00 and TLC flash cells may have eight bell curves, etc.); and a shift value for each of the reference voltages 518, which may be set with same initial value for the reference voltages.

Of course, the above list is not limiting and many variations may be envisioned in view of this disclosure. For example, as discussed in more detail below with regard to FIG. 11, the implementations discussed herein combine threshold voltage shifts (e.g. read disturb or retention loss shifts) and reference voltage shifts programmed by commands from the controller into a shift value 518 for storage as metadata. Other implementations may maintain threshold voltage shifts and reference voltage shifts as separate metadata values and use combine the values when conducting bit flip calculations.

Figure 6:
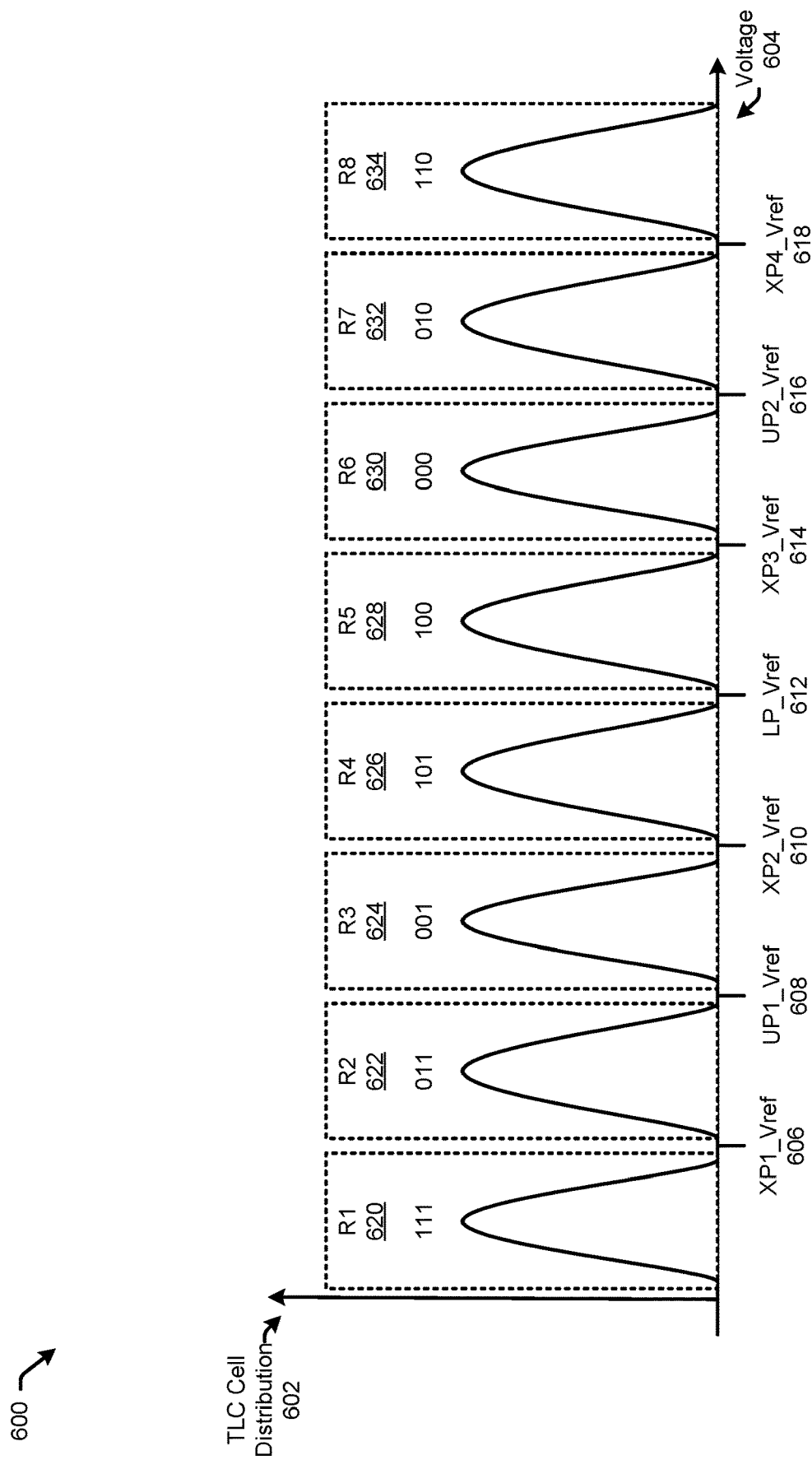
FIGS. 6-10 are example diagrams of distributions of cell values as stored in cells of an emulated flash storage device, in accordance with certain embodiments of the present disclosure.

FIG. 6 provides an example diagram 600 of the distribution 602 of possible stored cell values in a triple level cell as a function of voltage 604. As illustrated, each cell value the TLC cell can hold is represented by a region 620-634, with each region being separated by a reference voltage 606-618. Specifically, cells having a threshold voltage in the region R1 620 (e.g. below the reference voltage XP1_$V_{ref}$ 606) represent the three-bit value 1 1 1; cells having a threshold voltage in the region R2 622 (e.g. above the reference voltage XP1_$V_{ref}$ 606 and below the reference voltage UP1_$V_{ref}$ 608) represent the three-bit value 0 1 1; cells having a threshold voltage in the region R3 624 (e.g. above the reference voltage UP1_$V_{ref}$ 608 and below the reference voltage XP2_$V_{ref}$ 610) represent the three-bit value 0 0 1; cells having a threshold voltage in the region R4 626 (e.g. above the reference voltage XP2_$V_{ref}$ 610 and below the reference voltage LP_$V_{ref}$ 612) represent the three-bit value 1 0 1; cells having a threshold voltage in the region R5 628 (e.g. above the reference voltage LP_$V_{ref}$ 612 and below the reference voltage XP3_$V_{ref}$ 614) represent the three-bit value 1 0 0; cells having a threshold voltage in the region R6 630 (e.g. above the reference voltage XP3_$V_{ref}$ 614 and below the reference voltage UP2_$V_{ref}$ 616) represent the three-bit value 0 0 0; cells having a threshold voltage in the region R7 632 (e.g. above the reference voltage UP2_$V_{ref}$ 616 and below the reference voltage XP4_$V_{ref}$ 618) represent the three-bit value 0 1 0; and cells having a threshold voltage in the region R8 634 (e.g. above the reference voltage XP4_$V_{ref}$ 618) represent the three-bit value 1 1 0.

The default values for the reference voltages 514 and the mean value ($\mu$) and standard deviation ($\sigma$) 516 for the bell curve for the threshold voltages of each cell value that may be stored by the cells may be utilized to determine the cell distribution shown in FIG. 6. In some examples, the bell curves for each cell value indicate the probability of any given cell storing that cell value having the specific threshold voltage at that coordinate when programmed.

The shift values for reference voltages 518 may indicate an amount to shift reference voltages for any command from the flash controller. For example, if the flash controller issues a read command without adjusting the reference voltages, the bit flip calculation module 504 and bit flip module 506 may simulate the page read operations based on shifted reference voltages. For example, if the default reference voltage for a page is 60 $v_e$ and the corresponding shift value for that reference voltage was initially set to 10 $v_e$, the bit flip calculation module 504 and bit flip module 506 may simulate the read operation being performed with that reference voltage at 70 $v_e$.

In some implementations, the page may simulate being affected by retention loss or read disturbance depending on whether the shift value is positive or negative, respectively. For example, in the case of retention loss, the shift value 518 may be any positive value. On the other hand, in the case of read disturbance, the shift value 518 may be any negative value. The larger the absolute value of the shift value 518, the greater degree of retention loss or read disturbance is present. In such an implementation, this portion of the shift value may be determined, for example, based on a read counter and a time that has passed since the page was programmed. Finally, if the page is to be simulated without retention or read disturbance, the shift value 518 may be zero (0).

Once the page is configured and a read command is received, the bit flip calculation module 504 may calculate a percentage of bit flips for each bell curve associated with the requested page 524 (e.g. in the case of the TLC extra page (XP): for each unique value of XP, UP, LP; in the case of the MLC or TLC upper page (UP): for each unique value of UP and LP; and in the case of the SLC, MLC and TLC lower page (LP): each unique value of LP). In other words, for each bell curve, the bit flip calculation module may determine a percentage of cells having threshold voltages in that bell curve to perform bit flips on (e.g. whose bit associated with the current page is to be flipped). For example, in the case of a cell distribution of the MLC upper page, the bit flip calculation module 504 may calculate a percentage of bit flips for four bell curves representing cell values 1 1, 0 1, 1 0 and 0 0. As one of ordinary skill in the art would understand how to determine the portions of a bell curve between boundaries in view of this disclosure, the calculations for such a determination have been omitted for brevity. However, as a general matter, as the reference voltages are shifted, the final data read may also change. The new values may be calculated for each bell curve. To do this, all the cells which have the same relation to the threshold voltage with all reference voltages may be grouped together. Then, a percentage of cells which read out different than the original data (as read by default reference voltages) may be found out.

After determining the percentage of bit flips for each bell curve, the bit flip calculation module 504 may obtain the full values of each cell associated with the current page 522 based on the original data of target word line 520 (e.g. in the case of TLC: the bit values for the XP, UP, and LP pages; in the case of the MLC: the bit values of the UP and LP pages; and in the case of the SLC: the bit value of the LP page). The bit flip calculation module 504 may then send the type of the flash storage device 510, the target page type 512, full cell values 522 (e.g. the bits represented by the cell) and the percentage of bit flips for each bell curve 524 to the bit flip module 506.

For each bell curve, the bit flip module 506 may then determine the number (X) of cells in the page having the associated cell value. The bit flip module may then determine the number of cells (Y) that is equal to the determined percentage (Z) of the number of cells (X) in the page having the associated cell value (e.g. Y=X*Z).

Then, for each bell curve, the bit flip module 506 may then randomly select the number of cells (Y) from among cells having the associated cell value and perform bit flips on the bit of the selected cells. For example, if the flash type is TLC, when handling the bell curve for the cell value of LP: 1, UP: 1, and XP: 1, the percentage of bit flips for this bell curve is 60%, and target page is XP, the bit flip module 506 may determine how many cells have the value 1 1 1. The bit flip module 506 may then randomly select and flip the XP page data of 60% of the determined number of cells whose original data was LP: 1, UP: 1, and XP: 1.

In another example, if the current page is the MLC upper page, then the bit flip calculation module may determine the percentage of bit flips for four bell curves (e.g., for cells whose original data was LP:1, UP:1, then for LP:1, UP:0, then for LP:0, UP:0 and last for LP:0, UP:1). These percentages 524 may then be sent as separate inputs to the bit flip module 506 for each of four iterations, one for each set of inputs from the bit flip calculation module 504. In each iteration, the bit flip module 506 may flips bits for one bell curve (e.g. in iteration 1, it may flip bits for cells with LP:1 and UP:1, in iteration 2, it may flip bits for cells with LP:1 and UP:0, for iteration 3, it may flip bits for cells with LP:0 and UP:0 and for iteration 4, it may flip bits for cells with LP:0 and UP:1)

Once the bit flip module 506 has performed flips on the different bell curves, output data 526 including the bit flips may be made available to the flash controller or for further processing by the data corruption module. The output data 526 may represent the data read with shifted reference voltages.

In some implementations, the flash controller may determine that the data has corruption due to shifts in the threshold voltages of the cells of the current page. In response, the flash controller may instruct the virtual flash device to adjust the reference voltages to compensate and potentially remove the corruption. Each time the flash controller sends a command to change a certain reference voltage, the bit flip calculation module 504 may operate to adjust the shift value 518 associated with that reference voltage 514.

Additionally, as the flash controller may adjust the reference values in the wrong direction or the virtual flash device may determine that the threshold voltage of the page changed due to ongoing reads or retention losses, additional bit flips may be needed to match the changed threshold voltage. In such cases, the bit flip module may operate to maintain the previously selected cells while adding additional cells to meet the updated percentage.

Moreover, the threshold voltage shift values for the page may be stored as metadata (e.g. each time the threshold voltage shift values are modified by the flash controller or due to the virtual flash device determining that the threshold voltages of the page changed due to ongoing read disturbances or retention losses). When the page is read again, the threshold voltage shift values stored as metadata may be used rather than starting again from the default or initial values. As mentioned above, some implementations may store the portion of the shift value based on commands from the controller (e.g. reference voltage shifts) separate from the threshold shift caused by read disturbances or retention losses. In such examples, these values may be combined during bit flip operations.

Many variations would be apparent in view of this disclosure. For example, in some implementations, for each read, the data corruption module may check metadata to determine if a page has been programmed to simulate read disturbances or retention loss. If so, voltage reference shift processing is performed as above. On the other hand, if the page has not been programmed to simulate read disturbances or retention loss, processing by the system 500 may be skipped. Further, many of the features discussed herein may not be included in all implementations.

FIGS. 7-10 illustrate an example of operation of the bit flip calculation module and bit flip module in which a flash controller may attempt to adjust the reference voltages to compensate for threshold voltage shifts.

More particularly, FIGS. 7-10 provide example diagrams 700-1000 of the distribution of possible cell threshold voltages in a triple level cell as a function of voltage 704. As illustrated, each data value the TLC cell can hold is represented by a region R1 720 to R8 734, with each region being separated by a reference voltage 706-718. The diagram 700 is similar to diagram 600 but includes numeric values for the voltage axis. As such, for brevity and ease of understanding, discussion of items in FIG. 7 which are similar to those in FIG. 6 will not be repeated and, the discussion below will instead related to the additional details provided by FIG. 7.

Figure 7:
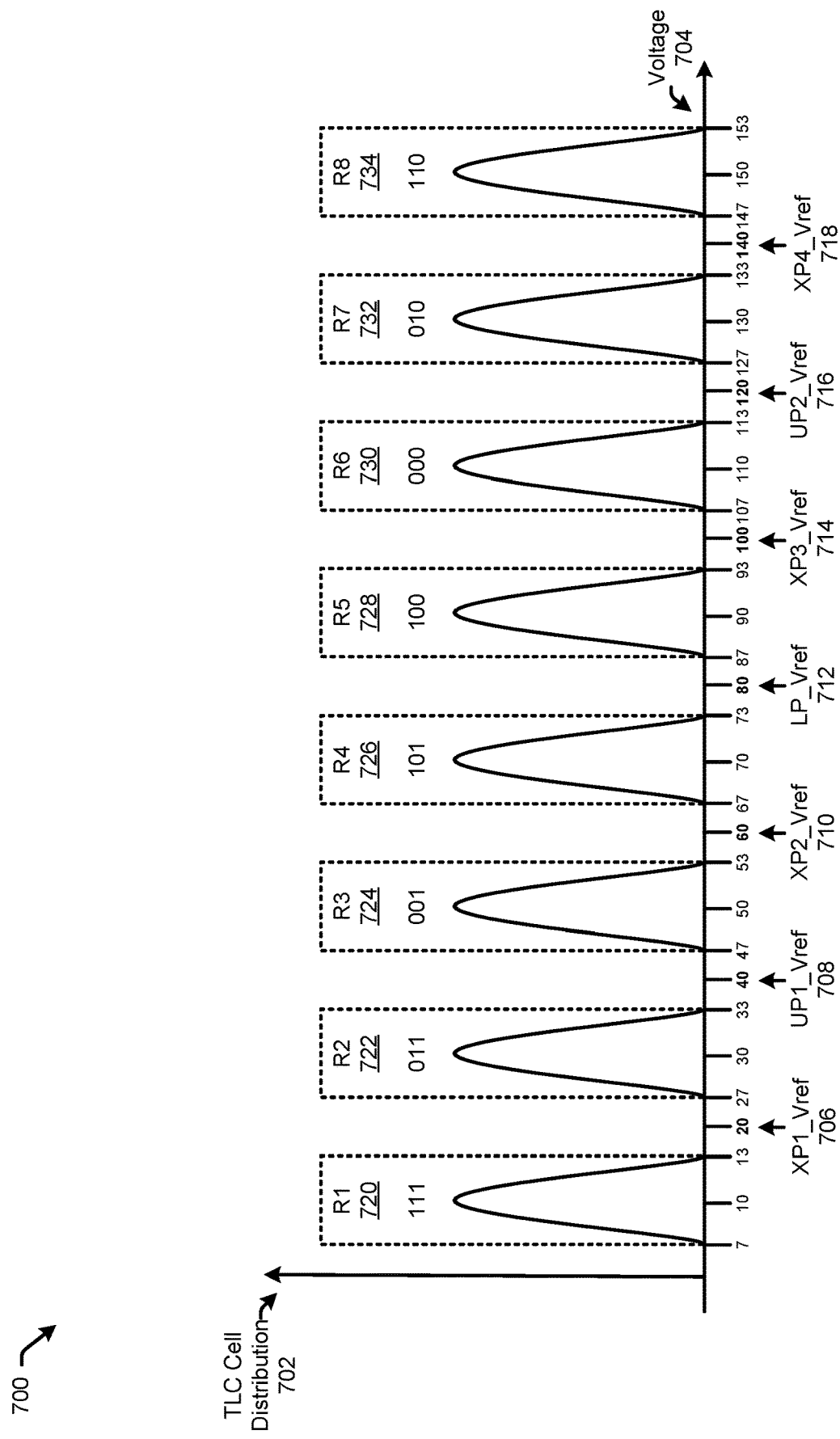

In the illustrated example of FIG. 7, the flash controller has configured a read request for a current page. The target page address of the current page may be page 11, block 0, die 0 and LUN 0. The type of flash storage device is TLC. As such, the cells associated with the current page may store eight cell values which correspond to eight bell curves defining regions R1 720 to R8 734.

As shown, the default values for the reference voltages are:

XP1_$V_{ref}$ 706=20,
XP2_$V_{ref}$ 710=60,
XP3_$V_{ref}$ 714=100,
XP4_$V_{ref}$ 718=140
UP1_$V_{ref}$ 708=40,
UP2_$V_{ref}$ 716=120
LP_$V_{ref}$ 712=80

The bell curves for each of the regions R1 720 to R8 734 may be defined based on the respective mean (μ) and standard deviation (σ) of each bell curve. In particular, the mean and standard deviation for each bell curve are:

μ of R1=10
σ of R1=1
μ of R2=30
σ of R2=1
μ of R3=50
σ of R3=1
μ of R4=70
σ of R4=1
μ of R5=90
σ of R5=1
μ of R6=110
σ of R6=1
μ of R7=130
σ of R7=1

Though the illustrated examples herein include bell curves having the same standard deviation, this is merely for ease of illustration and examples may include different standard deviations for different bell curves.

From the perspective of the flash controller, read commands are being performed using the default reference voltages values 706-718. The perspective of the flash controller may be correct in the case of the threshold voltage shift values being zero (0) (e.g. no threshold voltage shift).

Figure 8:
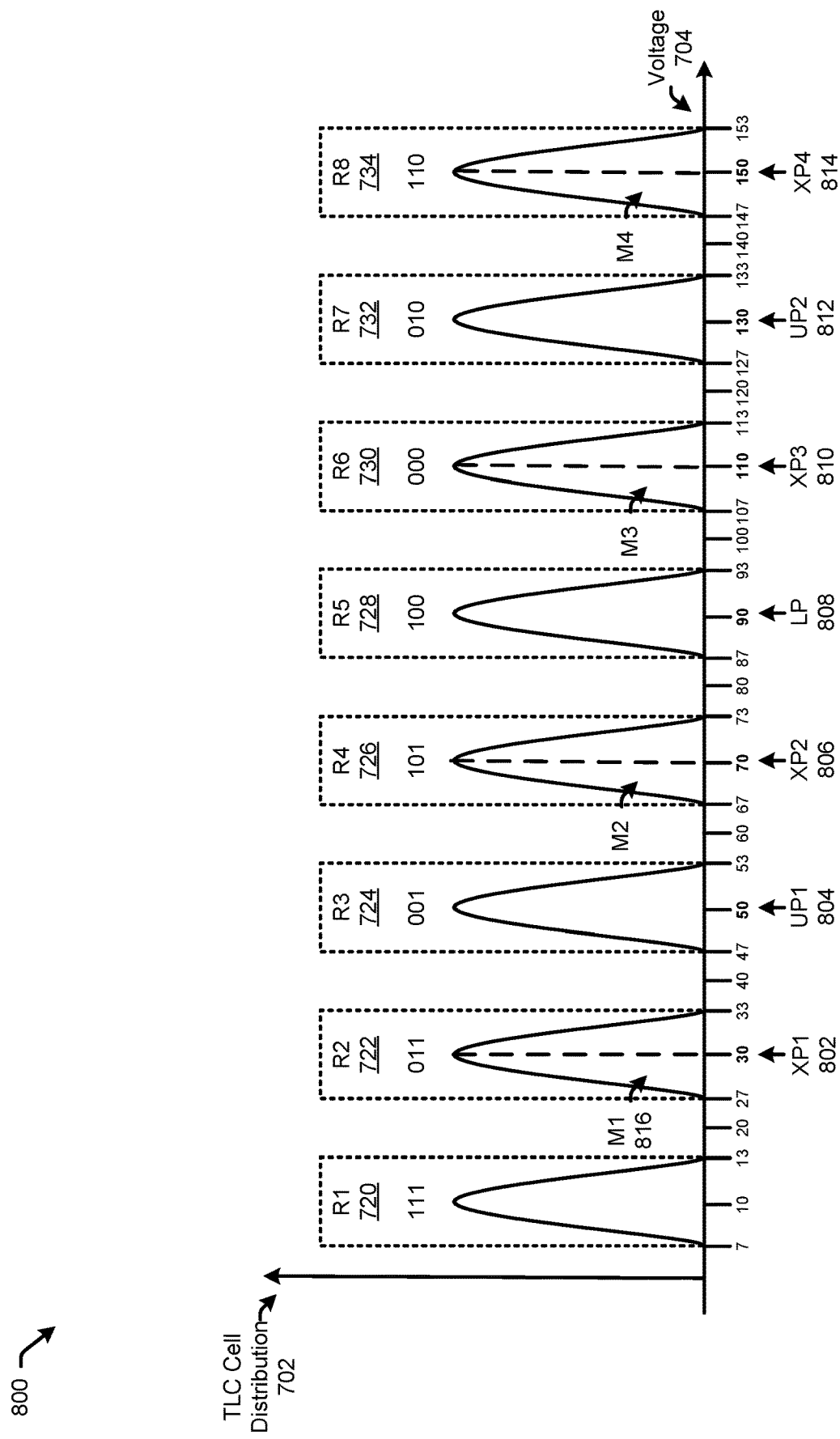

FIG. 8 illustrates a diagram 800 which illustrates the cell distribution of FIG. 7 from the perspective of a data corruption module of a virtual flash device where the initial shifts have been configured for the reference voltages. In particular, the initial threshold voltage shifts for the reference voltages are:

Initial shift for XP1_$V_{ref}$=10;
Initial shift for XP2_$V_{ref}$=10;
Initial shift for XP3_$V_{ref}$=10;
Initial shift for XP4_$V_{ref}$=10;
Initial shift for UP1_$V_{ref}$=10;
Initial shift for UP2_$V_{ref}$=10; and
Initial shift for LP_$V_{ref}$=10

As such, FIG. 8 shows the perspective of the bit flip calculation module when the flash controller issues a read command without adjustment of the reference values. Specifically, the bit flip calculation module may perform the determination of the percentage of bits to flip based on:

XP1 802=30,
XP2 806=70,
XP3 810=110,
XP4 814=150

UP1 804=50,
UP2 812=130,
LP 808=90

In operation, the bit flip calculation module may perform the following operations for the XP page.

For the region R1 720, the threshold voltage ($V_{th}$) of all cells under the region R1 have the same relation with shifted extra page reference voltages:

$V_{th}$<XP1, XP2, XP3 and XP4

As such, the same data is read by each shifted extra page reference voltage:

X1, X2, X3, X4=1
and
Final Data=(X1!!X2) & (X3!!X4)
=(1!!1) & (1!!1)
=1

Since the original data for the XP page of the region R1 was 1, the bit flip calculation module may determine that zero percent (0%) of the bits should be flipped due to the threshold voltage shift.

For the region R2 722, the bit flip calculation module may divide the region into two regions based the presence of the shifted XP1 802 within the range of the region R2 722. The first region includes cells with a threshold voltage ($V_{th}$) between 27 $v_e$ and the shifted XP1 (30 $v_e$) (shown with region M1 816). All cells in region M1 816 have the same relation with shifted extra page reference voltages:

$V_{th}$<XP1, XP2, XP3 and XP4

As such, the same data is read by each shifted extra page reference voltage:

X1, X2, X3, X4=1
and
Final Data=(X1!!X2) & (X3!!X4)
=(1!!1) & (1!!1)
=1

The second region of R2 722 includes cells within R2 722 but not in region M1 816, specifically cells with a threshold voltage ($V_{th}$) between the shifted XP1 (30 $v_e$) and 33 $v_e$. The relationship of cells in this region have the following relationship with the shifted extra page reference voltages:

XP1<$V_{th}$<, XP2, XP3 and XP4

As such, the data read by each shifted extra page reference voltage are:

X1=0 and X2, X3, X4=1
and
Final Data=(X1!!X2) & (X3!!X4)
=(0!!1) & (1!!1)
=0

As the original data for the extra page of the region R2 722 was 0, the shifting of the shifted extra page reference voltage XP1 has changed the read data for cells having a threshold voltage between 27 $v_e$ and XP1 802 (30 $v_e$) (e.g. cells in region M1 816) from 0 to 1. On the other hand, the read data for cells having a threshold voltage between XP1 802 (30 $v_e$) and 33 $v_e$ has not changed. As region M1 816 is half of region R2 724, the percentage bit flip for R2=50%.

The above process may be repeated for regions R3 724 to R8 734. Regions R4, R6 and R8 may each be processed in a similar manner to R2 (e.g. due to the division of the regions by a shifted reference voltage). Once the processing is complete, the result may be the following bit flip percentages:

R1: 0% flips
R2: 50% flips
R3: 0% flips
R4: 50% flips
R5: 0% flips
R6: 50% flips
R7: 0% flips
R8: 50% flips The bit flip calculation module 504 may provide the bit flip percentages, the contents of the cells of the page, and other information to the bit flip module 506. The bit flip module 506 may then select 50% of the cells of the page whose cell values are in R2, R4, R6, and R8 and flip the selected bit of those cells associated with the extra page XP. The modified read data may then be provided to the flash controller.

From the perspective of the flash controller, the flash storage device is reading data from the flash cells using the default reference voltages (e.g. 20, 60, 100, 140 $v_e$ for the XP). By performing error correction (e.g. using error correction codes), the flash controller may determine that the received read data is corrupt and attempt to adjust the reference voltages and request a re-reading of the current page.

Figure 9:
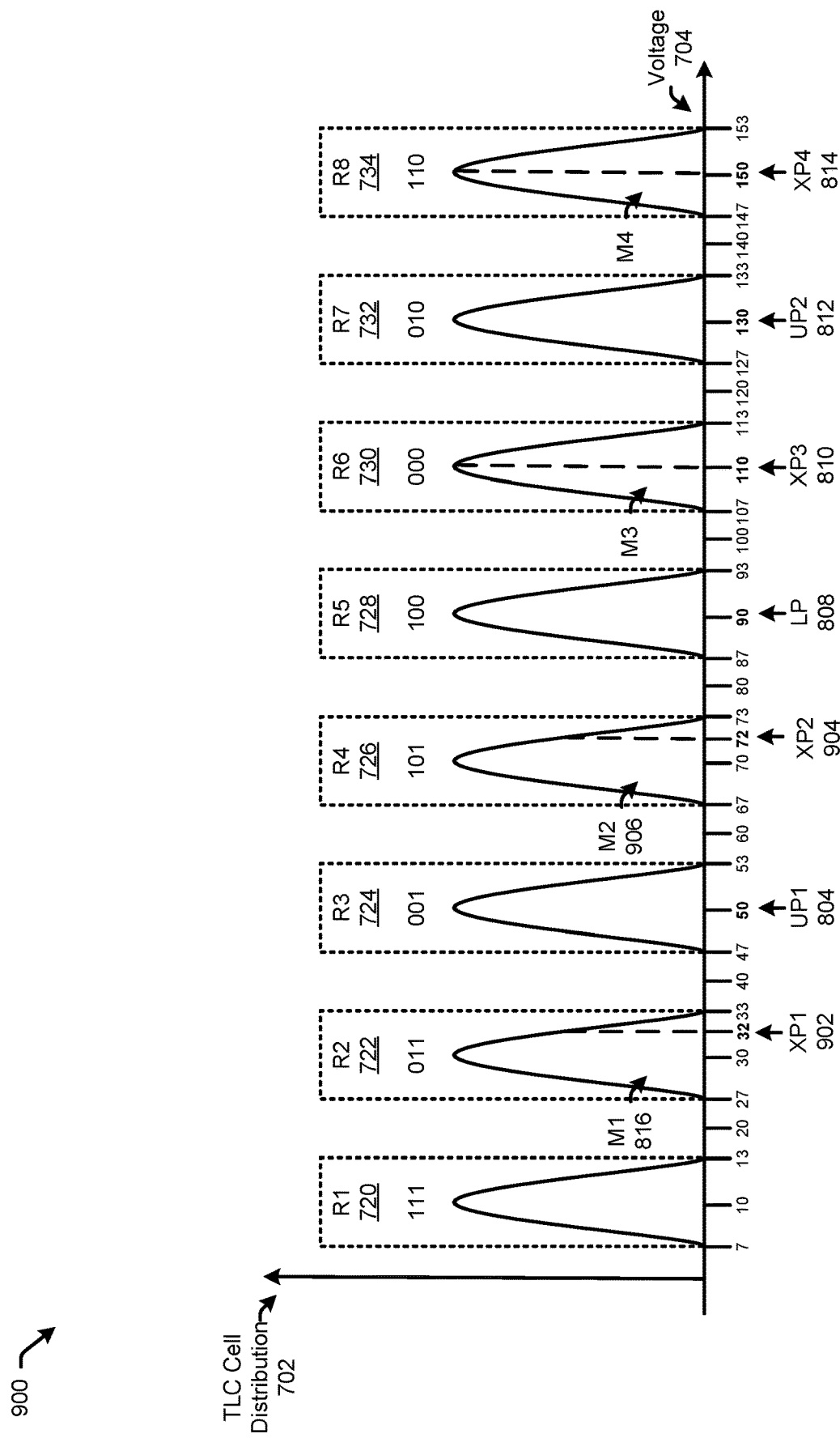

FIG. 9 illustrates the perspective of the bit flip calculation module following receipt and processing of a reference voltage shift instruction from the flash controller. In particular, the flash controller requested the reference voltages XP1 902 and XP2 904 be shifted by two (2) to 32 and 72, respectively. In some implementations, the shifts requested by the flash controller may be applied to the shift values of the reference voltages rather than the default values. Based on the adjustment, during the subsequent processing of a re-read command, the bit flip calculation module may perform the determination of the percentage of bits to flip based on:

XP1 902=32,
XP2 904=72,
XP3 810=110,
XP4 814=150
UP1 804=50,
UP2 812=130,
LP 808=90

The bit flip calculation module may perform the operations discussed above to determine bit flip percentages for the XP page. The result may be the following bit flip percentages:

R1: 0% flips
R2: 97.7% flips
R3: 0% flips
R4: 97.7% flips
R5: 0% flips
R6: 50% flips
R7: 0% flips
R8: 50% flips As shown above, the bit flip percentages are changed for regions R2 and R4. Specifically, the M1 816 region and the M2 906 region have grown due to the shifting of the reference voltages XP1 902 and XP2 904.

The area of the M1 816 region may be determined as the sum of the area between 27 $v_e$ to 30 $v_e$ and the area between 30 $v_e$ and 32 $v_e$. As such, M1 may be determined to be the sum of half the area of the bell curve and the area of the bell curve from the mean (μ) to two standard deviations (2σ) or (50%+47.7%) which is 97.7%. Performing similar operations on the M2 906 region may provide the same result. The bit flip module may then select and flip bits based on the percentages and provide the output data to the flash controller.

Thus, when the flash controller performs error correction operations, the flash controller may determine that the +2 $v_e$ shift has caused more errors. As such, the flash controller may attempt to shift the reference voltages in the other direction.

Figure 10:
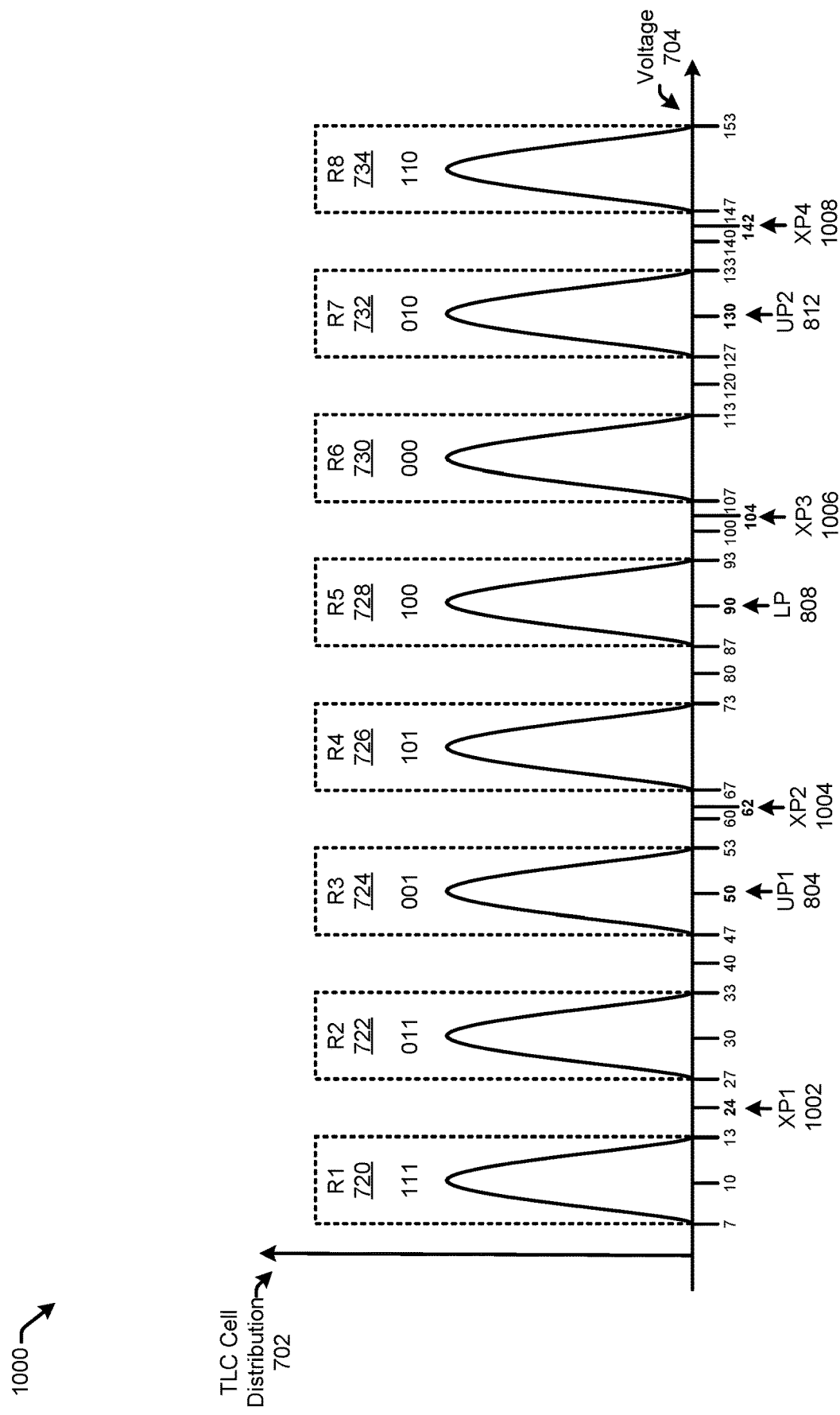

FIG. 10 illustrates the perspective of the bit flip calculation module following receipt and processing of another reference voltage shift instruction from the flash controller. In particular, the flash controller may request the reference voltages XP1 1002, XP2 1004, XP3 1006, and XP4 1008 be shifted by −8 $v_e$, −10 $v_e$, −6 $v_e$, and −8 $v_e$ to 24 $v_e$, 62 $v_e$, 104 $v_e$, and 142 $v_e$, respectively. Based on this adjustment, during the subsequent processing of a second re-read command, the bit flip calculation module may perform the determination of the percentage of bits to flip based on:

XP1 1002=24,
XP2 1004=62,
XP3 1006=104,
XP4 1008=142
UP1 804=50,
UP2 812=130,
LP 808=90

The bit flip calculation module may then perform the operations discussed above to determine bit flip percentages for the XP page. The result may be the following bit flip percentages:

R1: 0% flips
R2: 0% flips
R3: 0% flips
R4: 0% flips
R5: 0% flips
R6: 0% flips
R7: 0% flips
R8: 0% flips Because no bit flips are indicated, the bit flip module may return clean read data to the flash controller. In turn, the flash controller may successfully decode the read data (e.g. ECC) and the processing of the read commands for the current page may end.

Figure 11:
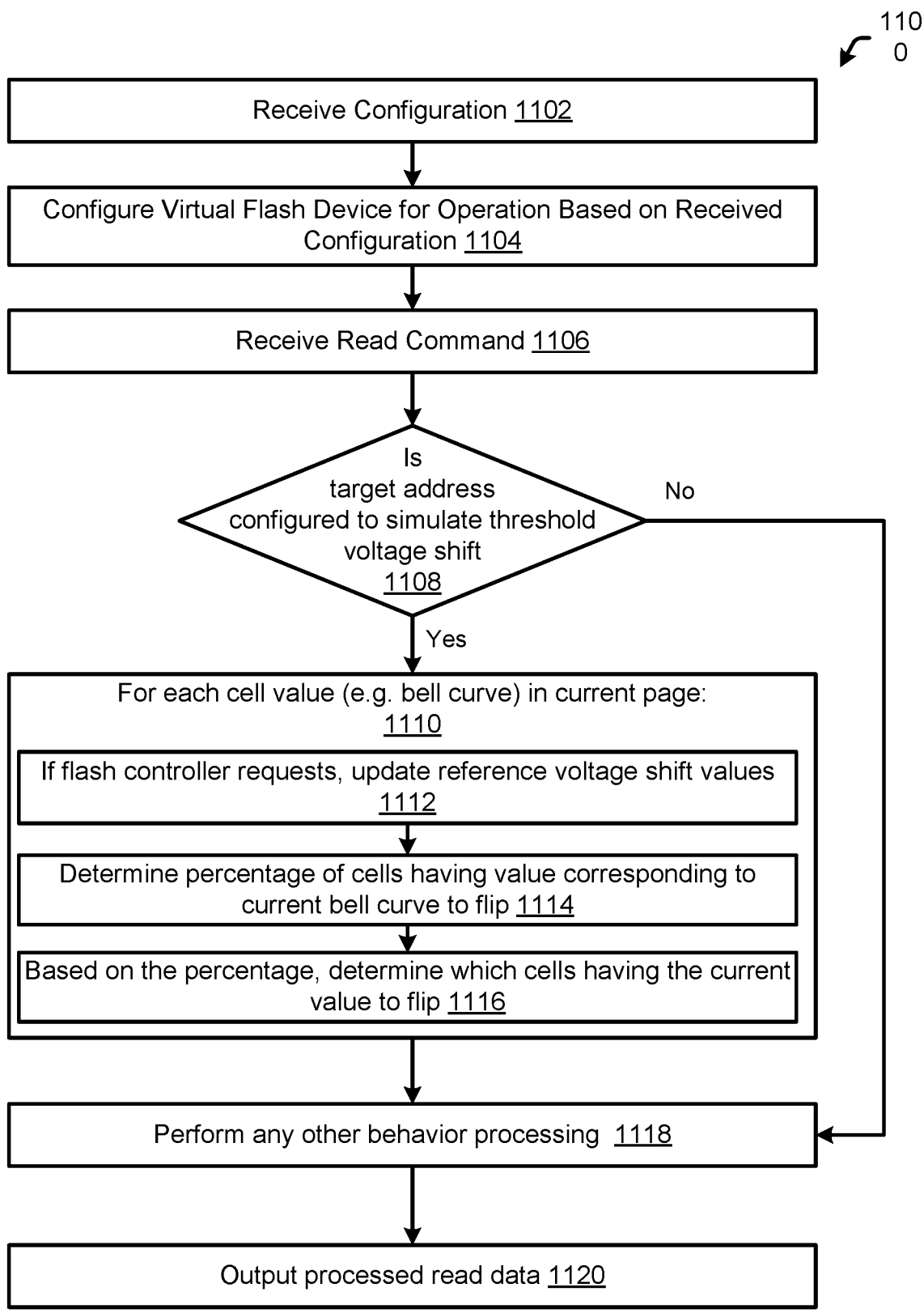
FIG. 11 is a flowchart of a method of emulating a flash storage device to a flash storage controller, in accordance with certain embodiments of the present disclosure.

Referring to FIG. 11, a flowchart of a method of emulating a flash storage device to a flash storage controller is shown and generally designated 1100, in accordance with certain embodiments of the present disclosure. Specifically, FIG. 11 provides an example method of the operation of systems and methods 100-1000 to allow a virtual flash system to emulate a flash storage device to a flash storage controller, for example, for purposes of testing the behavior of the flash controller when operating with flash storage device. In particular, method 1100 may be an example method for simulating data corruption due to threshold voltage shifts in cells of a flash storage device, for example, due to retention loss, read disturbance, etc.

At 1102, the virtual flash device may receive configuration information (e.g. from a configuration device). At 1104, the virtual flash device may configure itself for operation based on the received configuration. For example, the virtual flash device may configure itself for one or more pages of the emulated flash storage device to simulate threshold voltage shifts. At 1106, the virtual flash device may receive a read command.

The virtual flash device may determine whether a current page is configured to simulate threshold voltage shifts (e.g. read disturbance, retention loss, etc.). If so, the process may continue to 1110. Otherwise, the process may continue to 1118.

At 1110, the virtual flash device may perform bit flip processing for each cell value (e.g. bell curve) in the current page. The bit flip process may proceed as follows. At 1112, the virtual flash device may update the reference voltage shift values if the flash controller requests changes to the reference voltages. Next, the virtual flash device may determine the percentage of bits in the page having the current value to flip at 1114. At 1116, based on the determined percentage, the virtual flash device may determine a number of cells and randomly select that number of cells and flip the bits of the selected cells associated with the current page. As mentioned above, the process may repeat for each cell value (e.g. bell curve) in the current page.

At 1118, the virtual flash device may perform any other configured behavior processing, if any (e.g. wear modeling, intercell interference, etc.).

Finally, at 1120, the virtual flash device may output the modified read data to the flash controller.

Many variations would be apparent in view of this disclosure. For example, as discussed above regarding the more general process of FIG. 4, the virtual flash device may update metadata regarding wear, usage or other flash storage behavior (e.g. PE cycle counts, read count or time since last read, etc.). In some implementations, based on the updated meta data, the voltage shift values may be modified (e.g. based on the number of read operations, a time since the write and since the last read, etc.). Further, many of the features discussed herein may not be included in all implementations.

In the above discussions, various modules of the virtual flash device are discussed as performing particular operations. However, this is not limiting and implementations may have more or less modules or the functions may be distributed differently. For example, referring to FIG. 2, in some implementations, the configuration and monitor module may configure the other components of the virtual flash device directly (e.g. items 204, 208, and 216) instead of having the metadata and control module relay the configuration. These and other variations would be apparent to one of ordinary skill in the art in view this disclosure.

While the above description includes some embodiments that describe flash storage device implementations, the present disclosure can be applied to any system that needs to test storage controllers.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:
1. An apparatus comprising:
    a virtual flash device configured to emulate a flash memory device, the virtual flash device including:
        a flash interface configured to communicate with a flash controller;
        an address translation module configured to translate memory addresses from a flash based memory space to another memory space of another memory;
        a threshold voltage shift module configured to modify data on a data path between the flash controller and the other memory to simulate data corruption caused by threshold voltage shifts in cells of the emulated flash memory device; and
        a non-flash memory controller configured to communicate with the other memory.

2. The apparatus of claim 1, further comprising:
a meta data and control module configured to manage meta data from the emulation of the flash memory device, the meta data including threshold voltage shifts of cells of the emulated flash memory device.

3. The apparatus of claim 2, further comprising the threshold voltage shift module including:
a bit flip calculation module configured to:
determine a percentage of cells of a page of the flash based memory space storing a particular cell value for which the bit associated with the page is be to flipped; and
a bit flip module configured to:
select the determined percentage of cells of the page storing the particular cell value; and
flip the bit of the selected cells that is associated with the page.

4. The apparatus of claim 3, further comprising the bit flip calculation module further being configured to determine the percentage of cells of the page storing the particular cell value for which the bit associated with the page is be to flipped based at least in part on:
a mean and a standard deviation for the particular cell value for the cells associated with the page, the mean and the standard deviation of the particular cell value defining a bell curve representing a distribution of threshold voltages for cells having the particular cell value;
a respective default value for each reference voltage associated with the page; and
a respective threshold voltage shift value for a corresponding reference voltage.

5. The apparatus of claim 4, further comprising the threshold voltage shift module further configured to:
receive a request to change the corresponding reference voltage for the page; and
in response to receiving the request, adjust the respective threshold voltage shift value of the corresponding reference voltage.

6. The apparatus of claim 5, further comprising:
the bit flip calculation module further configured to:
determine, based on the adjusted threshold voltage shift value and the default value for the corresponding reference voltage, another percentage of cells of the page of the flash based memory space storing the particular cell value for which the bit associated with the page is be to flipped,
the bit flip module further configured to:
determine the other percentage is greater than the percentage;
in response to determining the other percentage is greater than the percentage:
maintain selection of the selected cells;
select additional cells to increase the percentage of selected cells storing the particular cell value to the other percentage, and
flip the bit of the selected cells and additional cells that is associated with the page.

7. The apparatus of claim 6, further comprising the threshold voltage shifts being configured to simulate one or more of retention loss and read disturbance.

8. The apparatus of claim 1, further comprising the emulated flash memory device being one of:
a single level cell flash storage device;
a multi level cell flash storage device; and
a triple level cell flash storage device.

9. The apparatus of claim 1, further comprising:
the other memory, the other memory being a DDR SDRAM memory device.

10. The apparatus of claim 1, further comprising the virtual flash device being a field programmable gate array (FPGA).

11. A device comprising:
a virtual flash device configured to emulate a flash memory device, the virtual flash device including a FPGA and the virtual flash device including:
a flash interface configured to communicate with a flash controller;
an address translation module configured to translate memory addresses from a flash based memory space to a memory space of a DDR SDRAM memory device;
a threshold voltage shift module configured to modify data on a data path between the flash controller and the DDR SDRAM memory device to simulate data corruption caused by threshold voltage shifts in cells of the emulated flash memory device;
a meta data and control module configured to manage meta data from the emulation of the flash memory device, the meta data including threshold voltage shifts of cells of the emulated flash memory device; and
a DDR SDRAM controller configured to communicate with the DDR SDRAM memory device.

12. The device of claim 11, further comprising the threshold voltage shift module including:
a bit flip calculation module configured to:
determine a percentage of cells of a page of the flash based memory space storing a particular cell value for which the bit associated with the page is be to flipped; and
a bit flip module configured to:
select the determined percentage of cells of the page storing the particular cell value; and
flip the bit of the selected cells that is associated with the page.

13. The device of claim 12, further comprising the bit flip calculation module further being configured to determine the percentage of cells of the page storing the particular cell value for which the bit associated with the page is be to flipped based at least in part on:
a mean and a standard deviation for the particular cell value for the cells associated with the page, the mean and the standard deviation of the particular cell value defining a bell curve representing a distribution of threshold voltages for cells having the particular cell value;
a respective default value for each reference voltage associated with the page; and
a respective threshold voltage shift value for a corresponding reference voltage.

14. The device of claim 13, further comprising:
the data path being a read data path; and
the threshold voltage shift module further configured to:
receive a request to change the corresponding reference voltage for the page; and
in response to receiving the request, adjust the respective threshold voltage shift value of the corresponding reference voltage.

15. The device of claim 14, further comprising:
the bit flip calculation module further configured to:
determine, based on the adjusted threshold voltage shift value and the default value for the corresponding reference voltage, another percentage of cells of the page of the flash based memory space storing the particular cell value for which the bit associated with the page is be to flipped, the bit flip module further configured to:
  determine the other percentage is greater than the percentage;
  in response to determining the other percentage is greater than the percentage, maintain selection of the selected cells;
  select additional cells to increase the percentage of selected cells storing the particular cell value to the other percentage; and
  flip the bit of the selected cells and additional cells that is associated with the page.

16. The device of claim 11, further comprising a data corruption module further configured to determine at least one bit of the page of the flash based memory space to be flipped to simulate inter-cell interference based at least in part on the value of the at least one bit and one or more bits surrounding the at least one bit.

17. A method comprising:
  configuring a virtual flash device emulate a flash memory device, the virtual flash device including a FPGA and the virtual flash device including a flash interface configured to communicate with a flash controller and a DDR SDRAM controller configured to communicate with a DDR SDRAM memory device;
  receiving a read command from the flash controller;
  translating a memory address from a flash based memory space included in the read command to a memory space of the DDR SDRAM memory device;
  retrieving data from the DDR SDRAM memory device using the translated memory address;
  modifying the retrieved data to simulate data corruption caused by threshold voltage shifts in cells of the emulated flash memory device; and
  outputting the modified data to the flash controller as a response to the read command.

18. The method of claim 17, further comprising:
  determining a percentage of cells of a page of the flash based memory space storing a particular cell value for which the bit associated with the page is be to flipped; and
  selecting the determined percentage of cells of the page storing the particular cell value; and
  flipping a bit of the selected cells that is associated with the page.

19. The method of claim 18, further comprising performing the determining of the percentage of cells of the page storing the particular cell value for which the bit associated with the page is be to flipped based at least in part on:
  a mean and a standard deviation for the particular cell value for the cells associated with the page, the mean and the standard deviation of the particular cell value defining a bell curve representing a distribution of threshold voltages for cells having the particular cell value;
  a respective default value for each reference voltage associated with the page; and
  a respective threshold voltage shift value for a corresponding reference voltage.

20. The method of claim 19, further comprising:
  receiving a request to change the corresponding reference voltage for the page; and
  in response to receiving the request, adjusting the respective threshold voltage shift value of the corresponding reference voltage.

* * * * *